United States Patent
Chung et al.

(10) Patent No.: US 8,338,213 B2
(45) Date of Patent: Dec. 25, 2012

(54) METHOD FOR MANUFACTURING SOLAR CELL

(75) Inventors: Indo Chung, Seoul (KR); Jinah Kim, Seoul (KR); Jeongbeom Nam, Seoul (KR); Juhong Yang, Seoul (KR); Seunghwan Shim, Seoul (KR); Ilhyoung Jung, Seoul (KR); Hyungjin Kwon, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/350,462

(22) Filed: Jan. 13, 2012

(65) Prior Publication Data

US 2012/0184063 A1  Jul. 19, 2012

(30) Foreign Application Priority Data

Jan. 14, 2011  (KR) .................. 10-2011-0004081

(51) Int. Cl.
*H01L 21/00* (2006.01)

(52) U.S. Cl. ............... 438/57; 438/72; 438/73

(58) Field of Classification Search .............. 438/57, 438/69, 72, 73, 312, 314, 320; 136/249, 136/258
See application file for complete search history.

(56) References Cited

U.S. PATENT DOCUMENTS

2005/0134857 A1* 6/2005 Maury et al. .......... 356/432
2009/0260681 A1* 10/2009 Yun et al. .............. 136/256

* cited by examiner

*Primary Examiner* — Kevin M Picardat
(74) *Attorney, Agent, or Firm* — Birch, Stewart, Kolasch & Birch, LLP

(57) ABSTRACT

A method for manufacturing a solar cell includes forming an impurity doped region of a second conductive type at a substrate of a first conductive type, sequentially irradiating laser shots onto the impurity doped region of the substrate to form an emitter part including a first emitter region having a first sheet resistance and a second emitter region having a second sheet resistance less than the first sheet resistance, and forming a plurality of first electrodes connected to the second emitter region and forming a second electrode connected to the substrate.

20 Claims, 10 Drawing Sheets

METHOD FOR MANUFACTURING SOLAR CELL

This application claims priority to and the benefit of Korean Patent Application No. 10-2011-0004081, filed in the Korean Intellectual Property Office on Jan. 14, 2011, the entire contents of which are incorporated herein by reference.

BACKGROUND OF THE INVENTION

1. Field of the Invention

Embodiments of the invention relate to a method for manufacturing a solar cell.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which have different conductive types, for example, a p-type and an n-type and form a p-n junction, and electrodes respectively connected to the semiconductor parts of the different conductive types.

When light is incident on the solar cell, a plurality of electron-hole pairs are produced in the p-n junction of the semiconductor parts. The electron-hole pairs are separated into electrons and holes by the photoelectric effect. The separated electrons move to the n-type semiconductor part, and the separated holes move to the p-type semiconductor part. Then, the electrons are collected by the electrodes electrically connected to the n-type semiconductor part, and the holes are collected by the electrodes electrically connected to the p-type semiconductor part. The electrodes are connected to each other using electric wires to thereby obtain electric power.

SUMMARY OF THE INVENTION

In one aspect, there is a method for manufacturing a solar cell including forming an impurity doped region of a second conductive type at a substrate of a first conductive type, sequentially irradiating laser shots onto the impurity doped region of the substrate to form an emitter part including a first emitter region having a first sheet resistance and a second emitter region having a second sheet resistance less than the first sheet resistance, and forming a plurality of first electrodes connected to the second emitter region and forming a second electrode connected to the substrate, wherein a total overlap area of the laser shots irradiated onto a unit area of a first area of the impurity doped region to form the first emitter region is less than a total overlap area of the laser shots irradiated onto a unit area of a second area of the impurity doped region to form the second emitter region.

A maximum irradiation number of the laser shots irradiated onto the unit area of the second area may be greater than a maximum irradiation number of the laser shots irradiated onto the unit area of the first area.

A first laser shot and a second laser shot of the laser shots may be irradiated onto the first area and the second area. An overlap area between the first laser shot and the second laser shot in the second area may be greater than an overlap area between the first laser shot and the second laser shot in the first area.

An overlap rate between the first laser shot and the second laser shot in the second area may be greater than an overlap rate between the first laser shot and the second laser shot in the first area.

The overlap rate between the first laser shot and the second laser shot in the second area may be about 90% to 95%, and the overlap rate between the first laser shot and the second laser shot in the first area may be about 70% to 80%.

A width of the laser shots irradiated onto the first area may be equal or greater than a width of the laser shots irradiated onto the second area.

The laser shots together may have a stripe shape, and a length of the laser shots may be equal or greater than a length of one side of the substrate parallel to the plurality of first electrodes.

The forming of the plurality of first electrodes and the second electrode may include forming a bus bar which extends in a direction crossing the plurality of first electrodes and is connected to the first emitter region and the plurality of first electrodes.

A portion of the bus bar crossing the plurality of first electrodes may be connected to the second emitter region.

The forming of the impurity doped region may include depositing impurities of the second conductive type on the substrate to form the impurity doped region.

The forming of the impurity doped region may include implanting impurities of the second conductive type into the substrate using an ion implantation method to form the impurity doped region inside the substrate.

The forming of the impurity doped region may include applying a paste or an ink containing impurities of the second conductive type on the substrate and drying the paste or the ink applied on the substrate to form the impurity doped region on the substrate.

The first sheet resistance may be about 90 $\Omega$/sq. to 120 $\Omega$/sq., and the second sheet resistance may be about 30 $\Omega$/sq. to 50 $\Omega$/sq.

The forming of the plurality of first electrodes and the second electrode may include forming a bus bar which extends in a direction crossing the plurality of first electrodes and is connected to the first emitter region and the plurality of first electrodes.

A portion of the bus bar crossing the plurality of first electrodes may be connected to the second emitter region.

The method may further include forming an anti-reflection layer on the emitter part. The plurality of first electrodes and the bus bar may pass through the anti-reflection layer and may be connected to at least one of the first emitter region and the second emitter region.

The sequentially irradiating of the laser shots onto the impurity doped region of the substrate may occur parallel to a direction the bus bar extends.

The forming of the plurality of first electrodes and the second electrode may include forming a surface field region in the substrate adjoining the second electrode when the second electrode is formed.

The impurity doped region may have a sheet resistance of about 300 $\Omega$/sq. to 400 $\Omega$/sq.

An impurity doping thickness of the first emitter region may be different from an impurity doping thickness of the second emitter region.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
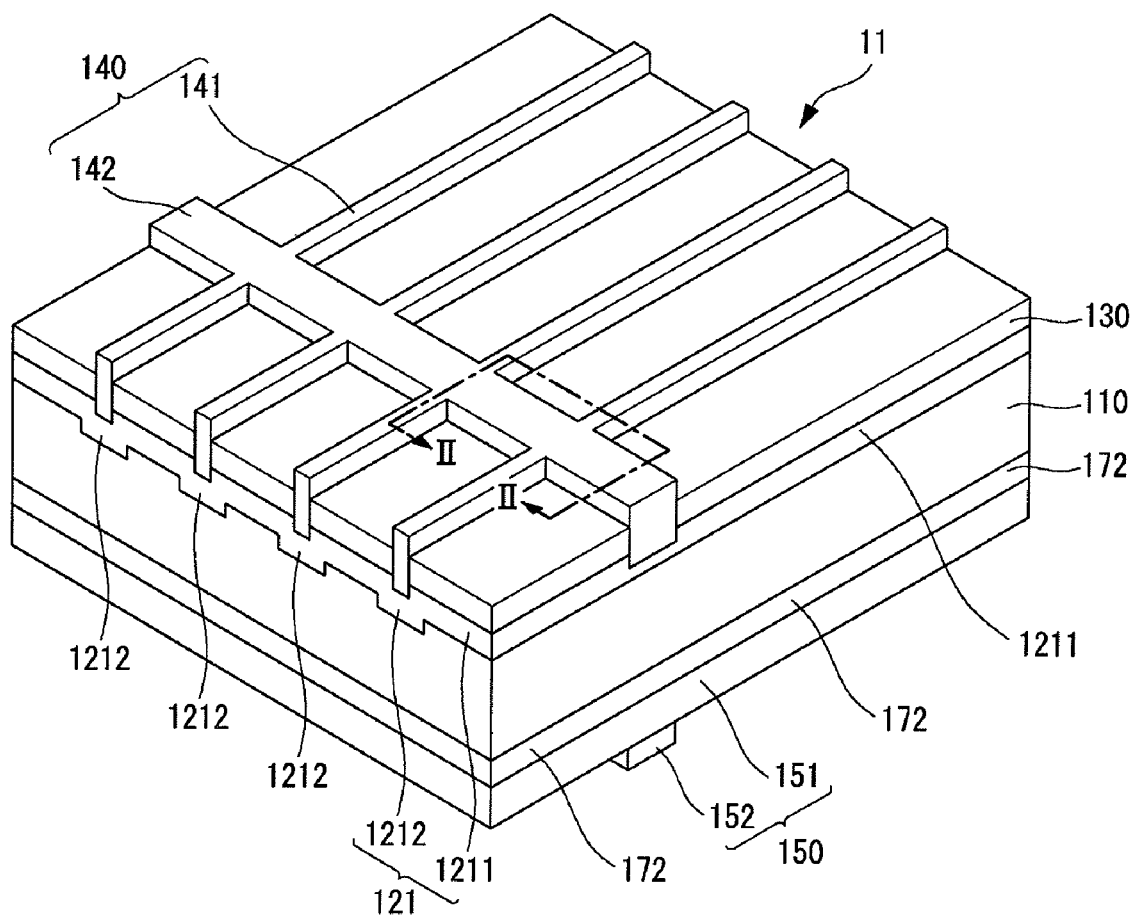
FIG. 1 is a partial perspective view of a solar cell according to an example embodiment of the invention.

Embodiments of the invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A method for manufacturing a solar cell according to an example embodiment of the invention is described with reference to the accompanying drawings.

A solar cell according to an example embodiment of the invention is described below with reference to FIGS. 1 and 2.

Figure 2:
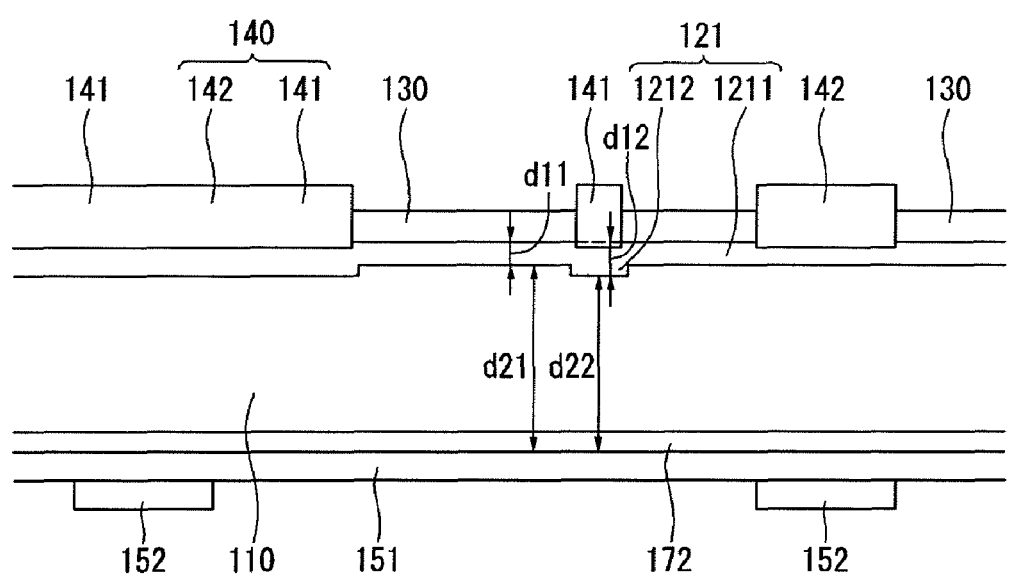
FIG. 2 is a cross-sectional view taken along line II-II of FIG. 1.

As shown in FIGS. 1 and 2, a solar cell 11 according to an embodiment of the invention includes a substrate 110, an emitter part 121 positioned at an incident surface (hereinafter, referred to as "a front surface or a first surface") of the substrate 110 on which light is incident, an anti-reflection layer 130 positioned on the emitter part 121, a front electrode part (or a first electrode part) 140 which is positioned on the emitter part 121 and includes a plurality of front electrodes (or a plurality of first electrodes) 141 and a plurality of front bus bars (or a plurality of first bus bars) 142, a back surface field (BSF) region (or surface field region) 172 positioned at a surface (hereinafter, referred to as "a back surface or a second surface") opposite the incident surface of the substrate 110, and a back electrode part (or a second electrode part) 150 which is positioned on the back surface of the substrate 110 and includes a back electrode (or a second electrode) 151 and a plurality of back bus bars (or a plurality of second bus bars) 152.

The substrate 110 is a semiconductor substrate formed of a semiconductor such as first conductive type silicon, for example, p-type silicon, though not required. The semiconductor is a crystalline semiconductor such as single crystal silicon and polycrystalline silicon.

When the substrate 110 is of the p-type, the substrate 110 is doped with impurities of a group III element such as boron (B), gallium (Ga), and indium (In). Alternatively, the substrate 110 may be of an n-type and may be formed of a semiconductor material other than silicon. If the substrate 110 is of the n-type, the substrate 110 may be doped with impurities of a group V element such as phosphorus (P), arsenic (As), and antimony (Sb).

The front surface of the substrate 110 may be textured to form a textured surface corresponding to an uneven surface having a plurality of projections and a plurality of depressions or having uneven characteristics.

When the front surface of the substrate 110 has the textured surface, a surface area of the substrate 110 increases and an incident area of light increases. Hence, an amount of light reflected from the substrate 110 decreases, and an amount of light incident on the substrate 110 increases.

The emitter part 121 is an impurity doped region doped with impurities of a second conductive type (for example, n-type) opposite the first conductive type (for example, p-type) of the substrate 110. The emitter part 121 is positioned at the front surface of the substrate 110. Thus, the emitter part 121 of the second conductive type forms a p-n junction along with a first conductive type region (for example, a p-type region) of the substrate 110.

The emitter part 121 includes a first emitter region 1211 and a second emitter region 1212. An impurity doping thickness of the first emitter region 1211 is different from an impurity doping thickness of the second emitter region 1212.

In the embodiment of the invention, the impurity doping thickness of the first emitter region 1211 is less than the impurity doping thickness of the second emitter region 1212. Thus, an impurity doping concentration of the first emitter region 1211 is less than an impurity doping concentration of the second emitter region 1212.

As above, because the impurity doping thicknesses of the first and second emitter regions 1211 and 1212 are different from each other, a distance between a surface (a contact surface between the anti-reflection layer 130 and the first emitter region 1211) of the substrate 110 and a p-n junction surface (hereinafter, referred to as "a first junction surface") between the first emitter region 1211 and the substrate 110 is different from a distance between a surface (a contact surface between the front electrode 141 and the second emitter region 1212) of the substrate 110 and a p-n junction surface (hereinafter, referred to as "a second junction surface") between the second emitter region 1212 and the substrate 110. For example, as shown in FIGS. 1 and 2, a first shortest distance d11 between the surface of the substrate 110 and the first junction surface is shorter than a second shortest distance d12 between the surface of the substrate 110 and the second junction surface.

Further, the first junction surface and the second junction surface inside the substrate 110 are positioned on different parallel lines. Hence, a third shortest distance d21 between the back surface of the substrate 110 and the first junction surface is longer than a fourth shortest distance d22 between the back surface of the substrate 110 and the second junction surface. The parallel lines are parallel to the front surface or the back surface of the substrate 110.

If the front surface of the substrate 110 has the textured surface, it may be considered that the first and third shortest distances d11 and d21 and the second and fourth shortest distances d12 and d22 are substantially equal to each other within the margin of error obtained by a difference between the heights of the uneven portions of the textured surface.

Sheet resistances of the first and second emitter regions 1211 and 1212 are different from each other because of a difference between the impurity doping thicknesses of the first and second emitter regions 1211 and 1212. In general, a sheet resistance is inversely proportional to an impurity doping thickness. Therefore, in the embodiment of the invention, because the impurity doping thickness of the first emitter region 1211 is less than the impurity doping thickness of the second emitter region 1212, the sheet resistance of the first emitter region 1211 is greater than the sheet resistance of the second emitter region 1212.

For example, the sheet resistance of the first emitter region 1211 may be approximately 90 $\Omega$/sq. to 120 $\Omega$/sq., and the sheet resistance of the second emitter region 1212 may be approximately 30 $\Omega$/sq. to 50 $\Omega$/sq.

Accordingly, the emitter part 121 has a selective emitter structure including the first and second emitter regions 1211 and 1212 each having the different sheet resistance.

A plurality of electron-hole pairs produced by light incident on the substrate 110 are separated into electrons and holes by a built-in potential difference resulting from the p-n junction between the substrate 110 and the emitter part 121. Then, the electrons move to the n-type semiconductor, and the holes move to the p-type semiconductor. Thus, when the substrate 110 is of the p-type and the emitter part 121 is of the n-type, the holes move to the back surface of the substrate 110 and the electrons move to the emitter part 121.

Because the emitter part 121 forms the p-n junction along with the first conductive type region of the substrate 110, the emitter part 121 may be of the p-type when the substrate 110 is of the n-type in another embodiment of the invention that is unlike the above embodiment of the invention. In this instance, the electrons move to the back surface of the substrate 110 and the holes move to the emitter part 121.

Returning to the embodiment of the invention, when the emitter part 121 is of the n-type, the emitter part 121 may be doped with impurities of a group V element. On the contrary, when the emitter part 121 is of the p-type, the emitter part 121 may be doped with impurities of a group III element.

When the sheet resistance of the first emitter region 1211 is about 90 $\Omega$/sq. to 120 $\Omega$/sq., an amount of light reaching the substrate 110 may increase because of the thin first emitter region 1211. Hence, an amount of carriers produced in the substrate 110 may increase, and a moving distance of the carriers may shorten. As a result, a recombination and/or a disappearance of electrons and holes may be prevented or reduced, and a short-circuit current density Jsc may increase.

When the sheet resistance of the second emitter region 1212 is about 30 $\Omega$/sq. to 50 $\Omega$/sq., a contact resistance of the second emitter region 1212 decreases. Hence, when the second emitter region 1212 contacts the front electrode 141 positioned on the second emitter region 1212, a loss amount of carriers decreases. Further, a shunt error, in which the front electrode 141 passes through the second emitter region 1212 in the formation of the front electrodes 141 and contacts the substrate 110, is prevented because of the thicker second emitter region 1212. Hence, a fill factor of the solar cell 11 is improved.

The anti-reflection layer 130 positioned on the emitter part 121 may be formed of hydrogenated silicon nitride (SiNx:H), hydrogenated silicon oxide (SiOx:H), hydrogenated silicon oxynitride (SiOxNy:H), etc. Further, the anti-reflection layer 130 may made of a transparent material.

The anti-reflection layer 130 reduces a reflectance of light incident on the solar cell 11 and increases selectivity of a predetermined wavelength band, thereby increasing the efficiency of the solar cell 11.

The anti-reflection layer 130 performs a passivation function which converts a defect, for example, dangling bonds existing at and around the surface of the substrate 110 into stable bonds using hydrogen (H) injected into the anti-reflection layer 130 when the anti-reflection layer 130 is formed to thereby prevent or reduce a recombination and/or a disappearance of carriers moving to the surface of the substrate 110. Hence, the anti-reflection layer 130 reduces an amount of carriers lost by the defect at and around the surface of the substrate 110. As a result, the efficiency of the solar cell 11 is improved.

The anti-reflection layer 130 shown in FIGS. 1 and 2 has a single-layered structure, but in other embodiments of the invention, the anti-reflection layer 130 may have a multi-layered structure, for example, a double-layered structure. Further, the anti-reflection layer 130 may be omitted, if necessary or desired.

As described above, the front electrode part 140 includes the plurality of front electrodes 141 and the plurality of front bus bars 142.

The plurality of front electrodes 141 are electrically and physically connected to the second emitter region 1212 of the emitter part 121. The plurality of front electrodes 141 are spaced apart from one another at a distance between them and extend parallel to one another in a fixed direction. The plurality of front electrodes 141 collect carriers (for example, electrons) moving to the emitter part 121.

The plurality of front bus bars 142 are spaced apart from one another at a distance between them and extend parallel to one another in a direction (i.e., a direction perpendicular to the extension direction of the front electrodes 141) crossing the front electrodes 141. The plurality of front bus bars 142 are connected to the front electrodes 141 and are electrically and physically connected to the first and second emitter regions 1211 and 1212 of the emitter part 121. As shown in FIGS. 1 and 2, a portion of each front bus bar 142 crossing the front electrodes 141 is connected to the second emitter region 1212, and a remaining portion of each front bus bar 142 except the portion crossing the front electrodes 141 is connected to the first emitter region 1211. Thereby, each front bus bar 142 is connected to the first and second emitter regions 1211 and 1212.

Each front bus bar 142 is positioned on the same level layer as the plurality of front electrodes 141 and is electrically and physically connected to the front electrode 141 at the crossing of the front electrode 141 and the front bus bar 142.

Accordingly, as shown in FIG. 1, the plurality of front electrodes 141 have a stripe shape extending in a transverse (or longitudinal) direction, and the plurality of front bus bars 142 have a stripe shape extending in a longitudinal (or transverse) direction. Hence, the front electrode part 140 has a lattice shape on the front surface of the substrate 110.

Each front bus bar 142 collects not only carriers moving from the first emitter region 1211 contacting the front bus bar 142 but also carriers, which are collected by the front electrodes 141, and then transfers the collected carriers in a corresponding direction.

Because the front bus bars 142 have to collect carriers collected by the front electrodes 141 crossing the front bus bars 142 and have to transfer the collected carriers in a desired direction, a width of each front bus bar 142 is greater than a width of each front electrode 141.

In general, because a large number of carries move along the surface of the emitter part 121, carriers positioned in the first emitter region 1211 reach the surface of the first emitter region 1211 and then move to the front electrode part 140 along the surface of the first emitter region 1211. In this instance, because the first emitter region 1211 has the relatively thin impurity doping thickness, a moving distance of carriers moving to the surface of the first emitter region 1211 decreases. Thus, an amount of carriers collected by the front electrode part 140 increases, and the efficiency of the solar cell 11 is improved.

Because the first emitter region 1211 has the relatively low impurity doping concentration, an amount of carriers lost by impurities of the first emitter region 1211 decreases and an amount of carriers moving to the front electrode part 140 increases. Hence, the photoelectric efficiency of the solar cell 11 is improved. In addition, because the second emitter region 1212, which outputs carriers moving from the first emitter region 1211 to the front electrodes 141 contacting the first emitter region 1211, has the relatively high impurity doping concentration, the second emitter region 1212 has the better conductivity than the first emitter region 1211 and the sheet resistance less than the first emitter region 1211. Hence, the transfer efficiency of carriers output from the second emitter region 1212 to the front electrodes 141 is improved, and the efficiency of the solar cell 11 is improved.

As described above, the front bus bars 142 mainly collect carriers moving along the front electrodes 141 and transfer the collected carriers in the corresponding direction. Thus, although a portion of the front bus bar 142 except the crossing of the front electrode 141 and the front bus bar 142 is connected to the first emitter region 1211 having the relatively low impurity doping concentration, the transfer of carriers collected through the front electrodes 141 is smoothly performed.

The plurality of front bus bars 142 are connected to an external device and output collected carriers (for example, electrons) to the external device.

The front electrode part 140 including the plurality of front electrodes 141 and the plurality of front bus bars 142 is formed of at least one conductive material, for example, silver (Ag).

As described above, because the emitter part 121 has the selective emitter structure including the first and second emitter regions 1211 and 1212, the first emitter region 1211, which mainly performs the movement of carriers to the front electrodes 141, has the relatively low impurity doping concentration and the second emitter region 1212 adjoining the front electrodes 141 has the relatively high impurity doping concentration. Thus, an amount of carriers moving from the first emitter region 1211 to the second emitter region 1212 underlying the front electrodes 141 increases. Further, the conductivity of the second emitter region 1212 increases due to an increase in the impurity doping concentration, and a contact resistance between the second emitter region 1212 and the front electrodes 141 decreases. Therefore, an amount of carriers transferred from the second emitter region 1212 to the front electrodes 141 increases. As a result, a carrier collection rate of the front electrodes 141 increases, and the efficiency of the solar cell 11 is improved.

In the embodiment of the invention, the number of front electrodes 141 and the number of front bus bars 142 may vary, if necessary or desired.

The BSF region 172 is a region (for example, a $p^+$-type region) that is more heavily doped than the substrate 110 with impurities of the same conductive type as the substrate 110.

A potential barrier is formed by a difference between impurity doping concentrations of the first conductive type region of the substrate 110 and the BSF region 172, thereby preventing electrons from moving to the BSF region 172 used as a moving path of holes and making it easier for the holes to move to the BSF region 172. Thus, the potential barrier reduces an amount of carriers lost by a recombination and/or a disappearance of the electrons and the holes at and around the back surface of the substrate 110, and accelerates a movement of desired carriers (for example, holes), thereby increasing the movement of carriers to the back electrode part 150.

As described above, the back electrode part 150 includes the back electrode 151 and the plurality of back bus bars 152 connected to the back electrode 151.

The back electrode 151 contacts the BSF region 172 positioned at the back surface of the substrate 110 and is positioned on the entire back surface of the substrate 110. Alternatively, the back electrode 151 may be substantially positioned on the entire back surface of the substrate 11 except an edge of the entire back surface of the substrate 110.

The back electrode 151 contains a conductive material, for example, aluminum (Al).

The back electrode 151 collects carriers (for example, holes) moving to the BSF region 172.

Because the back electrode 151 contacts the BSF region 172 having the impurity doping concentration higher than the substrate 110, a contact resistance between the substrate 110 (i.e., the BSF region 172) and the back electrode 151 decreases. Hence, the transfer efficiency of carriers from the substrate 110 to the back electrode 151 is improved.

The plurality of back bus bars 152 are positioned on the back electrode 151 to be opposite to the front bus bars 142 with the substrate 110 interposed between them. The back bus bars 152 are spaced apart from one another at a distance between them and extend in a fixed direction (for example, the same direction as the extension direction of the front bus bars 142). In alternative example, the back bus bars 152 may be directly positioned on the back surface of the substrate 110, on which the back electrode 151 is not positioned, and may be opposite to the front bus bars 142. In this instance, the BSF region 172 may be not positioned at the back surface of the substrate 110 directly adjoining the back bus bars 152.

The back bus bars 152 collect carriers transferred from the back electrode 151 in the same manner as the front bus bars 142. In embodiments of the invention, the back bus bars 152 may be aligned with the front bus bars 142.

When the back bus bars 152 are connected to the external device, they output collected carriers (for example, holes) to the external device.

The back bus bars 152 may be formed of a material having better conductivity than the back electrode 151. The back bus bars 152 may contain at least one conductive material, for example, silver (Ag).

As above, the second emitter region 1212, which is a heavily doped region, exists only under each front electrode 141, except crossings of the front electrodes 141 and the front bus bars 142, and does not exist under each front bus bar 142. Therefore, a formation area of the second emitter region 1212 decreases. Hence, a recombination and/or a disappearance of carriers are prevented or reduced by the second emitter region 1212, i.e., the heavily doped region, and an amount of carriers collected by the front bus bars 142 further increases.

FIGS. 1 and 2 show one front bus bar 142 and one back bus bar 152. However, as described above, the plurality of front bus bars 142 and the plurality of back bus bars 152 are formed. An operation of the solar cell 11 having the above-described structure is described below.

When light irradiated to the solar cell 11 is incident on the substrate 110 through the anti-reflection layer 130, a plurality of electron-hole pairs are generated in the substrate 110 by light energy produced based on the incident light. In this instance, because a reflection loss of the light incident on the substrate 110 is reduced by the anti-reflection layer 130, an amount of light incident on the substrate 110 increases.

The electron-hole pairs are separated into electrons and holes by the p-n junction of the substrate 110 and the emitter part 121. Then, the electrons move to the n-type semiconductor part, for example, the emitter part 121, and the holes move to the p-type semiconductor part, for example, the substrate 110. The electrons moving to the emitter part 121 are collected by the front electrodes 141 and the front bus bars 142 and then move along the front bus bars 142. The holes moving to the substrate 110 are collected by the back electrode 151 and then move along the back bus bars 152. When the front bus bars 142 are connected to the back bus bars 152 using electric wires, current flows therein to thereby enable use of the current for electric power.

In the embodiment of the invention, a loss amount of carriers decreases due to the emitter part 121 having the selective emitter structure, and an amount of carriers moving to the front electrode part 140 increases. Hence, the efficiency of the solar cell 11 is greatly improved.

Hereinafter, a method for manufacturing a solar cell according to an example embodiment of the invention is described with reference to FIGS. 3A to 3F.

Figure 3A:
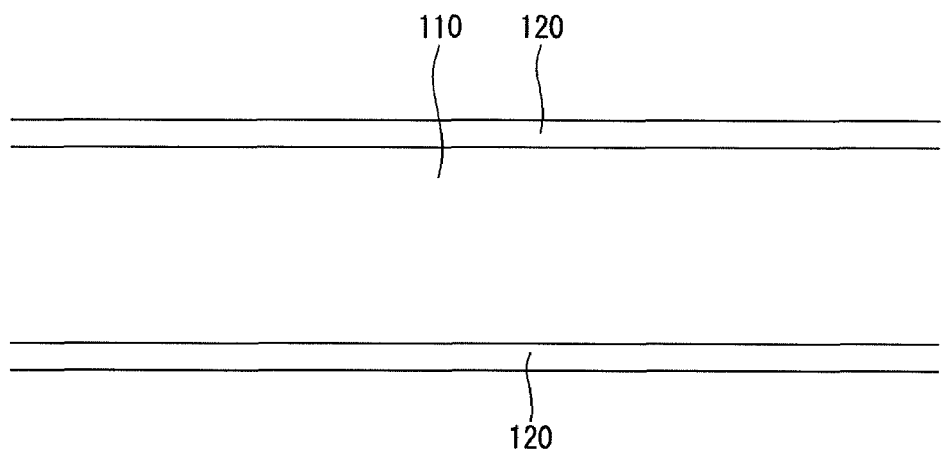
FIGS. 3A to 3F sequentially illustrate a method for manufacturing a solar cell according to an example embodiment of the invention.

First, as shown in FIG. 3A, a material containing impurities of a group V or III element is positioned in or on a crystalline semiconductor substrate 110 formed of single crystal silicon, polycrystalline silicon, etc., using a stacking method, an ion implantation method, etc., to form an impurity doped region 120 in or on the substrate 110. The impurity doped region 120 formed in or on the substrate 110 does not go through an impurity activation process. Thus, the impurity doped region 120 is in a state where impurities of a corresponding conductive type (for example, an n-type) are merely implanted into the substrate 110 without the impurity activation process or a state where a separate impurity doped region is formed on the substrate 110 without the impurity activation process. Thus, the impurities positioned in or on the substrate 110 are not chemically combined with silicon of the substrate 110. Namely, the impurities are physically implanted into the substrate 110 or are positioned on the substrate 110. Hence, the impurity doped region 120 cannot serve as an emitter part for a solar cell. In this instance, a sheet resistance of the impurity doped region 120 may be several hundreds of $\Omega$/sq., for example, about 300 $\Omega$/sq. to 400 $\Omega$/sq.

FIG. 3A illustrates an example of forming the impurity doped region 120 on the substrate 110 using the stacking method.

For example, FIG. 3A illustrates an example of depositing a carrier gas (for example, a nitrogen gas) and an impurity gas (for example, a $POCl_3$ gas or a $BBr_3$ gas) containing impurities of a group V or III element on the substrate 110 at a high temperature to form the impurity doped region 120 on the substrate 110. In this instance, the impurity doped region 120 is formed on both a front surface and a back surface of the substrate 110.

As another example of the stacking method, an impurity paste or an impurity ink may be screen-printed or spin-coated on the substrate 110 and then may be dried to form the impurity doped region 120 on the substrate 110. In this instance, the impurity doped region 120 may be formed only on a desired surface (for example, the front surface) of the substrate 110.

Further, the ion implantation method may be used to form the impurity doped region 120 inside the substrate 110. Namely, impurities of a group V or III element are implanted into the substrate 110 using the ion implantation method to form the impurity doped region 120 inside the substrate 110. In this instance, because a separate impurity thermal process is not performed in the ion implantation method, an impurity activation process of the impurity doped region 120 implanted into the substrate 110 is not performed. When the ion implantation method is used, the impurity doped region 120 may be formed only at the front surface of the substrate 110 unlike the structure illustrated in FIG. 3A.

If necessary, before the impurity doped region 120 is formed, a texturing process may be performed on the front surface or the front and back surfaces of the substrate 110 to form a textured surface of the substrate 110. When the substrate 110 is formed of single crystal silicon, the texturing process may be performed using a base solution such as KOH and NaOH. When the substrate 110 is formed of polycrystalline silicon, the texturing process may be performed using an acid solution such as HF and $HNO_3$.

Figure 3B:
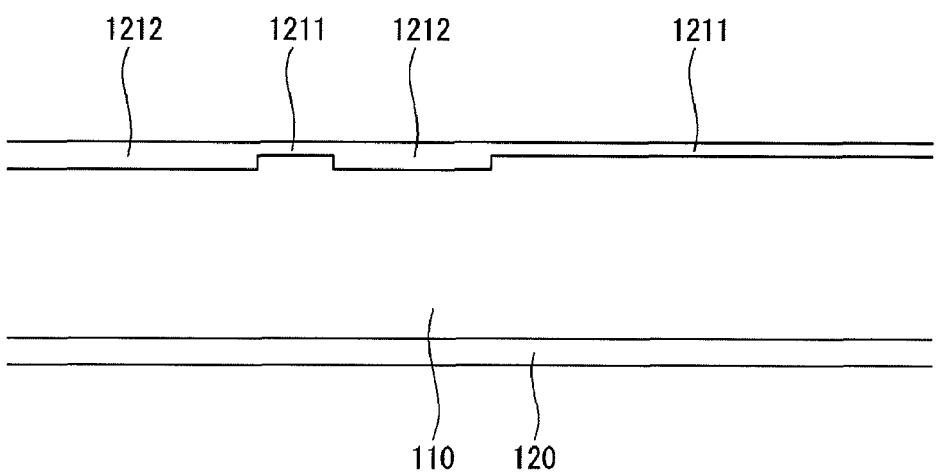

Next, as shown in FIG. 3B, a laser beam (or a laser shot) is irradiated onto the impurity doped region 120 positioned at the front surface of the substrate 110 to form a first emitter region 1211 having a first sheet resistance and a second emitter region 1212 having a second sheet resistance less than the first sheet resistance. Hence, an emitter part 121 including the first emitter region 1211 and the second emitter region 1212 is formed.

For example, the first sheet resistance of the first emitter region 1211 may be approximately 90 $\Omega$/sq. to 120 $\Omega$/sq., and the second sheet resistance of the second emitter region 1212 may be approximately 30 $\Omega$/sq. to 50 $\Omega$/sq.

In the embodiment of the invention, the laser shot is irradiated onto the impurity doped region 120 to perform a thermal process on the impurity doped region 120, so as to perform the impurity activation process for activating the impurity doped region 120. thus, during the impurity activation process, heat is applied to the impurity doped region 120 having the sheet resistance of several hundreds of $\Omega$/sq. (for example, about 300 $\Omega$/sq. to 400 $\Omega$/sq) to thereby form the stable chemical combination between impurities of the impurity doped region 120 and silicon of the substrate 110 and form the emitter part 121. The laser beam (shot) irradiated onto the impurity doped region 120 is an ultraviolet (UV) laser and uses a spot type or a thin type (i.e., a stripe type) beam. A wavelength of the laser beam may be about 308 nm to 351 nm.

Figure 4:
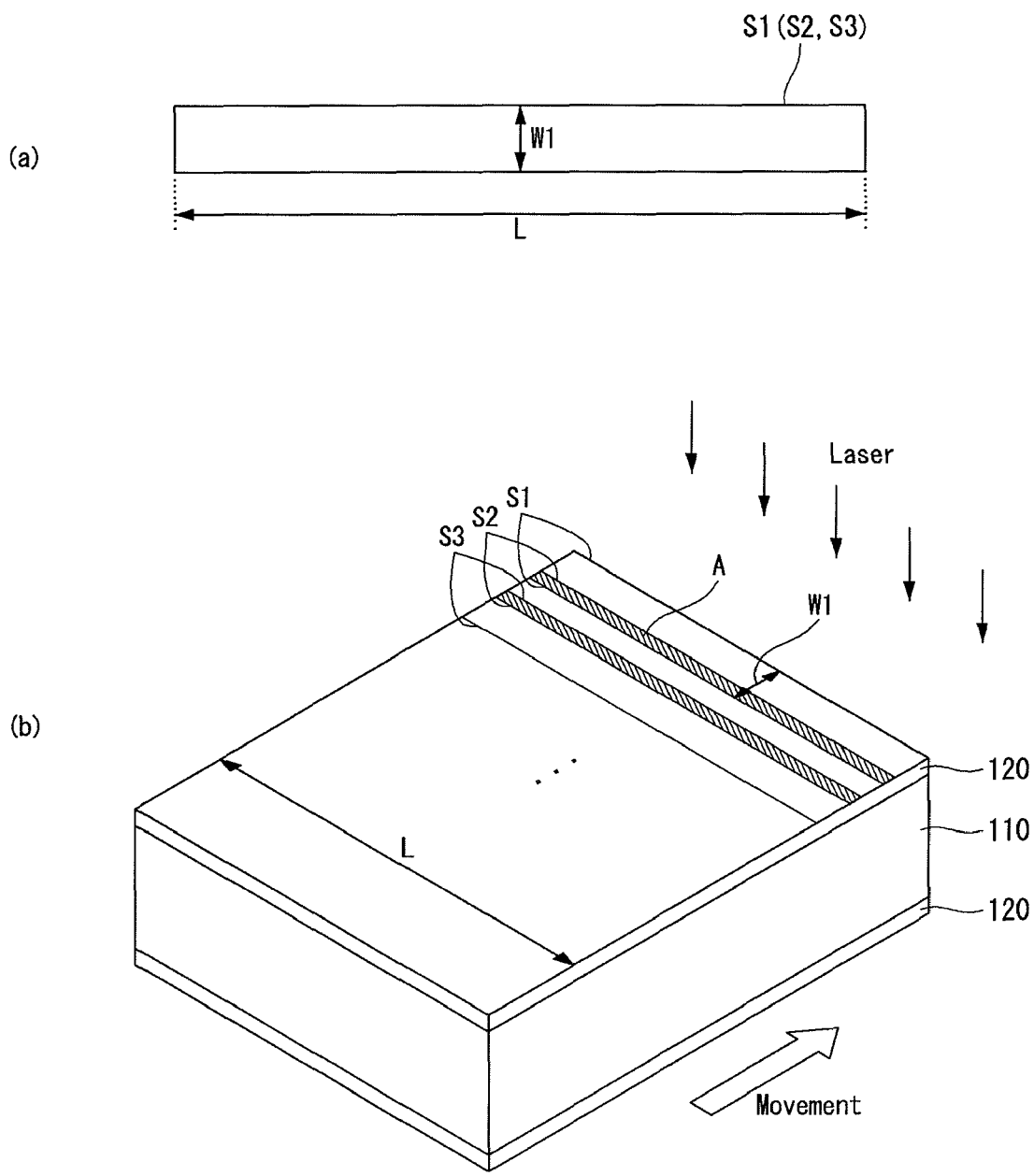
FIG. 4 illustrates examples of using a thin type laser beam according to an example embodiment of the invention, more specifically, (a) of FIG. 4 illustrates a thin type laser beam having a width W1 and a length L, and (b) of FIG. 4 is a perspective view schematically illustrating a thin type laser shot being irradiated onto a layer.

FIG. 4 illustrates an example of using a thin type laser beam.

As shown in (b) of FIG. 4, the impurity doped region 120 formed at the front surface of the substrate 110 is moved to a laser beam irradiation device and is exposed to the laser beam irradiation device. Then, the laser beam irradiation device irradiates a laser beam onto the impurity doped region 120. More specifically, as shown in (a) of FIG. 4, the laser beam irradiation device irradiates a thin type laser shot having a fixed width W1. As shown in (b) of FIG. 4, the laser beam irradiation device sequentially irradiates the thin type laser shot shown in (a) of FIG. 4 onto the impurity doped region 120. Then, the substrate 110 moves in a direction of an arrow shown in (b) of FIG. 4 based on an oscillation frequency of the laser beam. Hence, a next laser shot is irradiated onto a next irradiation location of the impurity doped region 120. In this instance, a moving direction of the substrate 110 is a direction crossing a plurality of front electrodes 141 (for example, a direction perpendicular to an extension direction of the plurality of front electrodes 141). Further, a length L of the irradiated laser shot is equal to or greater than a length of one side of the substrate 110 parallel to the extension direction of the front electrodes 141.

The laser beam is sequentially irradiated onto the entire surface of the impurity doped region 120 formed at the front surface of the substrate 110 through the above-described process to form the emitter part 121 including the first and second emitter regions 1211 and 1212 each having the desired sheet resistance.

When the laser shot is irradiated onto the impurity doped region 120, a laser shot overlaps an irradiation area of a previously irradiated laser shot in formation areas of the first and second emitter regions 1211 and 1212. In this instance, an overlap rate of the laser shots in a portion of the impurity doped region 120 to form the first emitter region 1211 is different from an overlap rate of the laser shots in a portion of the impurity doped region 120 to form the second emitter region 1212.

The formation location of the second emitter region 1212 is determined depending on a formation location of the front electrodes 141.

Figure 5:
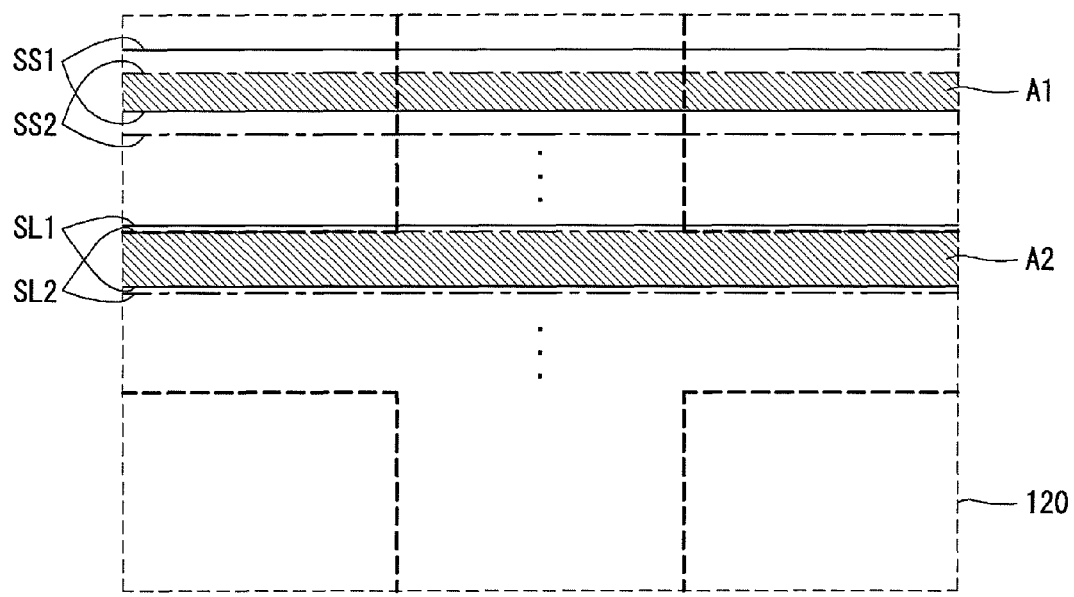
FIG. 5 is a perspective view schematically illustrating a thin type laser shot being irradiated onto an impurity doped region formed at a substrate in a solar cell according to an example embodiment of the invention.

Namely, as shown in FIGS. 4 and 5, when the laser shot is sequentially irradiated from one end to the other end of the substrate 110, a currently irradiated laser shot overlaps an irradiation area of a previously irradiated laser shot by a fixed rate (or an amount).

For example, as shown in FIG. 4, after a first laser shot S1 having the fixed width W1 is irradiated onto the impurity doped region 120, a second laser shot S2 overlaps an irradiation area of the first laser shot S1 by an oblique line area A shown in (b) of FIG. 4.

As described above, an overlap amount, i.e., an overlap rate of the laser shots irradiated onto the impurity doped region 120 varies depending on the formation locations of the first and second emitter regions 1211 and 1212.

Accordingly, when an area indicated by the dotted line shown in FIG. 5 is a formation area of a front electrode part 140 including the plurality of front electrodes 141 and a plurality of front bus bars 142 in the impurity doped region 120, an overlap area A1 between a laser shot SS2 irradiated onto a non-formation area (i.e., a formation area of the first emitter region) of the front electrode in the impurity doped region 120 and an irradiation area of a previously irradiated laser shot SS1 is less than an overlap area A2 between a laser shot SL2 irradiated onto a formation area (i.e., a formation area of the second emitter region) of the front electrode in the impurity doped region 120 and an irradiation area of a previously irradiated laser shot SL1. Hence, an overlap rate between the laser shot SL2 (hereinafter, referred to as a fourth laser shot) irradiated onto the formation area of the second emitter region and the irradiation area of the previously irradiated laser shot SL1 (hereinafter, referred to as a third laser shot) is greater than an overlap rate between the laser shot SS2 (hereinafter, referred to as a second laser shot) irradiated onto the formation area of the first emitter region and the irradiation area of the previously irradiated laser shot SS1 (hereinafter, referred to as a first laser shot). Namely, the first, second, third and fourth laser shots which are the same as each other are irradiated onto the first and second emitter regions, so that the formation areas of the first and second emitter regions each have the overlap area. Further, the overlap area between the third and fourth laser shots in the second emitter region is greater than the overlap area between the first and second laser shots in the first emitter region. In this instance, the laser shots irradiated onto the formation area of the first emitter region is substantially the same as the laser shots irradiated onto the formation area of the second emitter region.

The overlap rate of the laser shots SS1 and SS2 (or SL1 and SL2) indicates an overlap rate between a width of corresponding laser shots SS1 and SS2 or SL1 and SL2 and a width of an irradiation area of laser shots SS1 and SS2 or SL1 and SL2 directly adjacent to the corresponding laser shots SS1 and SS2 or SL1 and SL2. In the embodiment of the invention, the laser shots SS1 and SS2 and SL1 and SL2 respectively irradiated onto the formation areas of the first and second emitter regions have the same width W1 and the same length L. In an alternative example, the width of the laser shots SS1 and SS2 irradiated onto the formation area of the first emitter region may be greater than the width of the laser shots SL1 and SL2 irradiated onto the formation area of the second emitter region. Hence, an amount of the laser beam irradiated onto the formation area of the first emitter region may be less than an amount of the laser beam irradiated onto the formation area of the second emitter region.

In the embodiment of the invention, an overlap rate between a corresponding laser shot SS2 irradiated onto the formation area of the first emitter region and an irradiation area of a laser shot SS1 irradiated directly before the corresponding laser shot may be about 70% to 80%. Further, an overlap rate between a corresponding laser shot SL2 irradiated onto the formation area of the second emitter region and an irradiation area of a laser shot SL1 irradiated directly before the corresponding laser shot may be about 90% to 95%.

As above, because the overlap rate of the laser shots SS1 and SS2 irradiated onto the formation area of the first emitter region is different from the overlap rate of the laser shots SL1 and SL2 irradiated onto the formation area of the second emitter region, the irradiation number of laser shots irradiated onto the same area (i.e., a unit area) having the same size in the formation areas of the first and second emitter regions is differently determined. Namely, the overlap rate is proportional to the irradiation number of laser shots. More specifically, as the overlap rate (i.e., the overlap area) decreases, the irradiation number of laser shots irradiated onto the unit area decreases. Further, as the overlap rate (i.e., the overlap area) increases, the irradiation number of laser shots irradiated onto the unit area increases. Thus, the maximum irradiation number of laser shots in the unit area of the formation area of the second emitter region having the relatively large overlap rate is more than the maximum irradiation number of laser shots in the unit area of the formation area of the first emitter region having the relatively small overlap rate. Hence, the irradiation number of laser shots in the unit area of the formation area of the first emitter region is less than the irradiation number of laser shots in the unit area of the formation area of the second emitter region. As the irradiation number of laser shots increases, the number of thermal operations in the thermal process using the laser shots increases. Therefore, an amount of heat applied to the impurity doped region 120 for activating the impurity doped region 120 increases. Further, a doping concentration and a doping depth of impurities (of an activated impurity doped region functioning as an emitter part) doped into the substrate 110 increase, and a sheet resistance of the activated impurity doped region decreases. Hence, the first and second emitter regions 1211 and 1212, which are different from each other in a sheet resistance, an impurity doping thickness, and an impurity doping concentration, are respectively formed in the non-formation area and the formation area of the front electrodes.

As above, when the same laser shot is irradiated onto the formation areas of the first and second emitter regions 1211 and 1212, the entire overlap area of the laser shots irradiated onto the unit area of the formation area (hereinafter, referred to as a first area) of the first emitter region 1211 in the impurity doped region 120 is smaller than the entire overlap area of the laser shots irradiated onto the unit area of the formation area (hereinafter, referred to as a second area) of the second emitter region 1212 in the impurity doped region 120 due to a size difference between the overlap areas A1 and A2 of the laser shots, a difference between the overlap rates, or a difference between the irradiation number of laser shots in the formation areas of the first and second emitter regions 1211 and 1212.

As above described, when a selective emitter structure having the first and second emitter regions 1211 and 1212 is formed using the laser shots, the selective emitter structure is formed through a simple process. Hence, a damage of the substrate 110 is reduced.

For example, in a comparative example of forming the selective emitter structure having two emitter regions (that is, first and second emitter regions) each having a different impurity doping concentration using a thermal diffusion method, a masking layer formed of silicon nitride is formed on one surface of a substrate, and then a portion of the masking layer is removed to form an opening exposing a portion of the substrate. Then, using the thermal diffusion method, impurities are deposited on the substrate and an activation process is performed on the impurities deposited on the substrate to form the first emitter region having a first impurity doping concentration. Afterwards, the masking layer is removed. In the comparative example, the impurities are not doped on a portion of the substrate, on which the masking layer is formed, and the impurities are doped only on the portion of the substrate exposed through the opening at the first impurity doping concentration.

Next, impurities are again doped on the surface of the substrate, on which the masking layer is removed and the first emitter region is formed, at a second impurity doping concentration using the thermal diffusion method. Hence, the impurities are doped on a non-formation area of the first emitter region as well as a formation area of the first emitter region to form a second emitter region. In the comparative example, because the first impurity doping concentration is higher than the second impurity doping concentration, the first emitter region is a heavily doped region which is doped more heavily than the second emitter region.

Accordingly, the heavily doped region (i.e., the first emitter region) having the high doping concentration is formed at the exposed portion of the substrate, on which the masking layer is not formed. Further, the lightly doped region (i.e., the second emitter region) having the low doping concentration is formed at a portion of the substrate, on which the masking layer is formed.

As described above, in the comparative example using the thermal diffusion method, the impurity doping operation for the thermal diffusion is performed twice. Hence, the deterioration of the substrate is generated.

Further, the process for forming the separate masking layer for the lightly doped region and the process for forming the opening are necessary.

However, as described above, in the embodiment of the invention, only the inactivated impurity doped region 120 is formed inside the substrate 110 and then the thermal process, i.e., the laser shot irradiation process is performed once to form the first emitter region 1211 and the second emitter region 1212. Therefore, the substrate 110 is once exposed to the high temperature. Further, when the laser shot is irradiated, a temperature applied to the substrate 110 in the laser shot irradiation process is lower than a temperature applied to the substrate in the thermal diffusion method. Thus, the deterioration of the substrate 110 resulting from the temperature in the laser shot irradiation process is prevented or reduced.

Further, in the embodiment of the invention, because the process for forming the masking layer on the substrate and the process for removing the portion of the masking layer are not necessary, the manufacturing time and the manufacturing cost required to form the selective emitter structure are greatly reduced.

Furthermore, in the embodiment of the invention, when the emitter part 121 having the selective emitter structure is formed, the laser shot having the fixed width is sequentially irradiated onto the impurity doped region 120 of the substrate 110 without changes in process conditions such as a process temperature of a process room and a flow rate of a process gas, and a moving amount of the substrate 110 is adjusted based on a previously determined value. Therefore, only the overlap rate of the laser shots changes depending on the location of the impurity doped region 120. Hence, the manufacturing cost and time of the solar cell 11 is further reduced.

In the embodiment of the invention, when the overlap rate between corresponding laser shot SS2 irradiated onto the formation area of the first emitter region and an irradiation area of a laser shot SS1 irradiated directly before the corresponding laser shot is about 70% to 80%, the first emitter region stably has a desired sheet resistance. Further, when the overlap rate between a corresponding laser shot SL2 irradiated onto the formation area of the second emitter region and an irradiation area of a laser shot SL1 irradiated directly before the corresponding laser shot is about 90% to 95%, the second emitter region stably has a desired sheet resistance and an increase in manufacturing time of the emitter part 121 is prevented or reduced.

Figure 6:
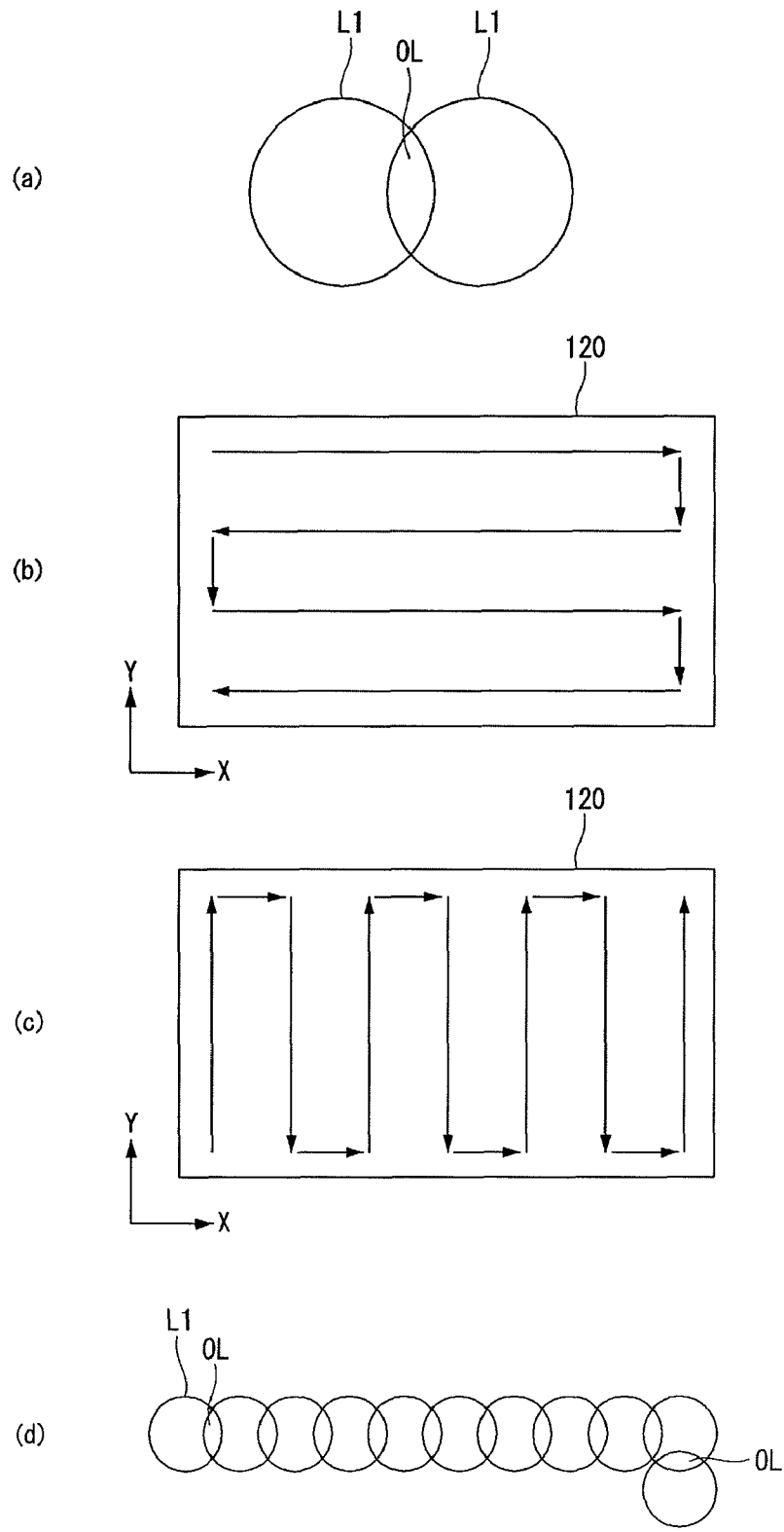
FIG. 6 illustrates examples of using spot type laser beams according to an example embodiment of the invention, more specifically, (a) of FIG. 6 illustrates an overlap of spot type laser beams, and (b) to (d) of FIG. 6 schematically illustrate an irradiation form of spot type laser beams irradiated onto an impurity doped region formed at a substrate in a solar cell according to an example embodiment of the invention.

So far, the embodiment of the invention describes the thin type laser beam, but embodiments of the invention may use a spot type laser beam L1 shown in (a) of FIG. 6. In this instance, as shown in (b) of FIG. 6, the spot type laser beam L1 is sequentially irradiated in a first direction (for example, a X-axis direction), in which the front electrode extends, and is irradiated onto the impurity doped region 120 while moving in zigzag. Then, as shown in (c) of FIG. 6, the spot type laser beam L1 is sequentially irradiated in a second direction (for example, Y-axis direction) perpendicular to the first direction and is irradiated onto the impurity doped region 120 while moving in zigzag. Hence, the thermal process is performed on the entire surface of the impurity doped region 120 using the spot type laser beam L1. In this instance, as shown in (a) of FIG. 6, one laser beam L1 is irradiated while overlapping an irradiation area of a laser beam L1 irradiated directly before the one laser beam L1. As shown in (d) of FIG. 6, an overlap area OL between the two successively laser beams L1 generates every time the laser beams L1 are irradiated moving in the first direction and the second direction.

Figure 7:
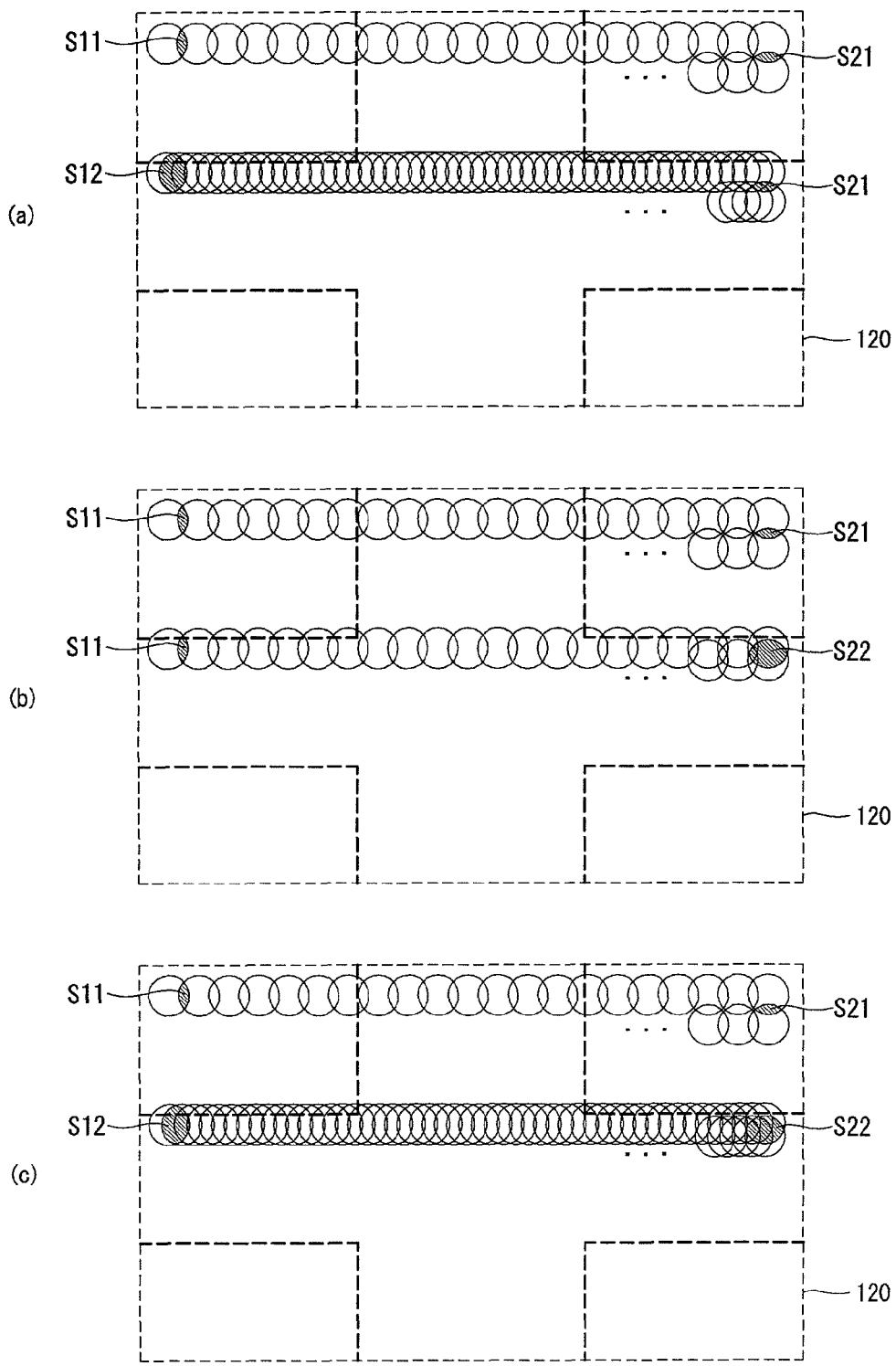
FIG. 7 schematically illustrates a selective emitter structure formed by changing an overlap rate of spot type laser beams irradiated onto an impurity doped region formed at a substrate in at least one of X-axis and Y-axis directions in a solar cell according to an example embodiment of the invention, more specifically, (a) of FIG. 7 illustrates an example where overlap rates of first and second emitter regions in the X-axis direction are different from each other, (b) of FIG. 7 illustrates an example where overlap rates of the first and second emitter regions in the Y-axis direction are different from each other, and (c) of FIG. 7 illustrates an example where overlap rates of the first and second emitter regions in the X-axis and Y-axis directions are different from each other.

In the same manner as the thin type laser beam, an overlap rate in the second emitter region is adjusted to be greater than an overlap rate in the first emitter region. In this instance, as shown in (a) and (b) of FIG. 7, overlap rates (i.e., overlap areas) S12 and S22 of the laser beams L1 irradiated in the first direction or the second direction in the second emitter region may be greater than overlap rates (i.e., overlap areas) S11 and S21 of the laser beams L1 irradiated in the first direction or the second direction in the first emitter region. Alternatively, as shown in (c) of FIG. 7, overlap rates S12 and S22 of the laser beams L1 irradiated in both the first and second directions in the second emitter region may be greater than overlap rates S11 and S21 of the laser beams L1 irradiated in both the first and second directions in the first emitter region. In (a) of FIG. 7, the overlap rate S21 in the second direction is the same, but the overlap rates S11 and S12 in the first direction are different. In (b) of FIG. 7, the overlap rates S21 and S22 in the second direction are different, but the overlap rate S11 in the first direction is the same. In (c) of FIG. 7, the overlap rates S21 and S22 in the second direction are different, and the overlap rates S11 and S12 in the first direction are different.

As above described, after the selective emitter structure having the first and second emitter regions 1211 and 1212 is formed using the laser shots, the impurity doped region 120 remaining in the substrate 110 is removed through the etching process.

Figure 3C:
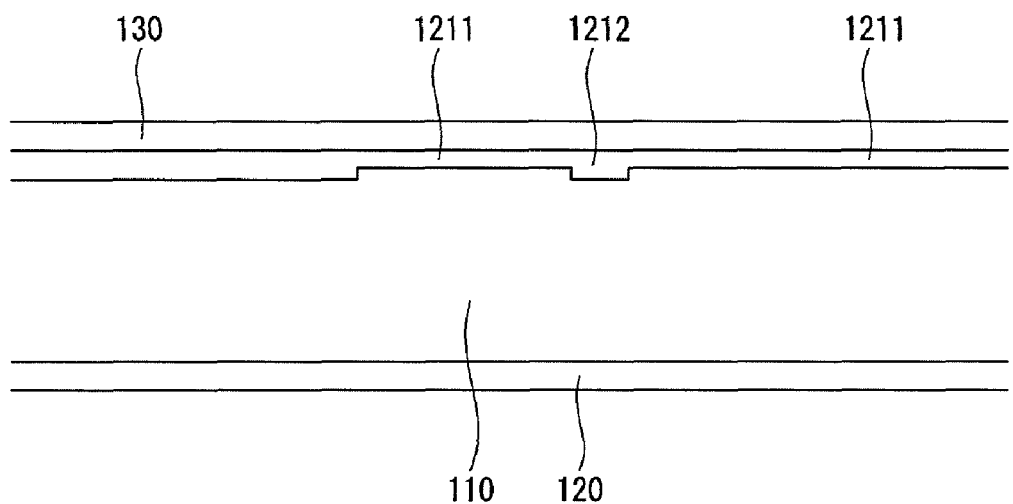

Next, as shown in FIG. 3C, an anti-reflection layer 130 is formed on the emitter part 121 formed at the front surface of the substrate 110 using a plasma enhanced chemical vapor deposition (PECVD) method, etc.

Figure 3D:
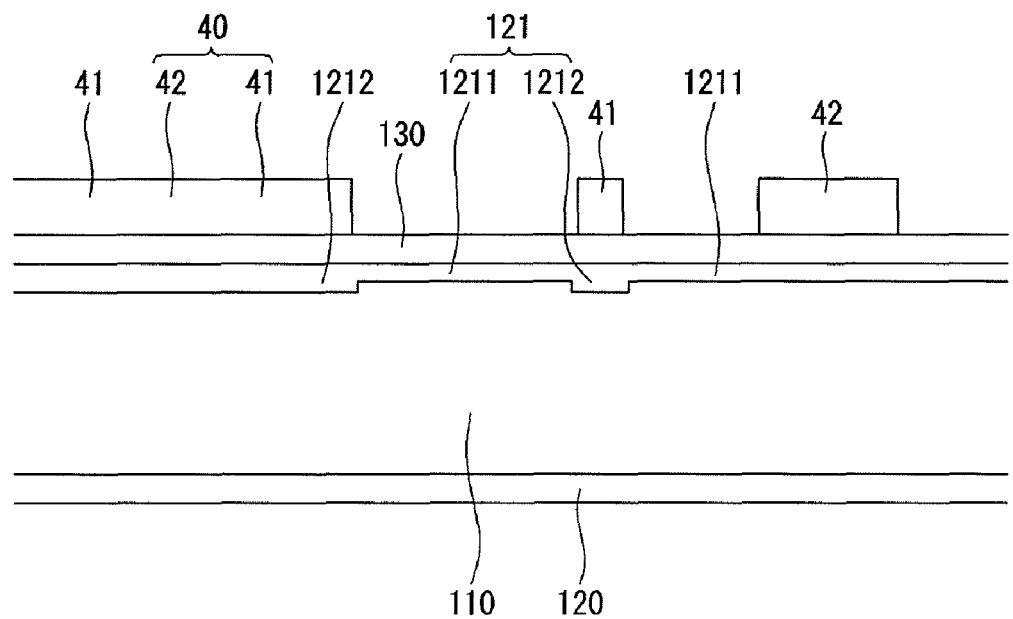

Next, as shown in FIG. 3D, a paste containing silver (Ag) is printed on a desired portion of the anti-reflection layer 130 using a screen printing method and then is dried to form a front electrode part pattern 40.

The front electrode part pattern 40 includes a front electrode pattern 41 and a front bus bar pattern 42. The front electrode pattern 41 is positioned on the second emitter region 1212, and the front bus bar pattern 42 is positioned on the first emitter region 1211. A crossing of the front electrode pattern 41 and the front bus bar pattern 42 is positioned on the second emitter region 1212.

Figure 3E:
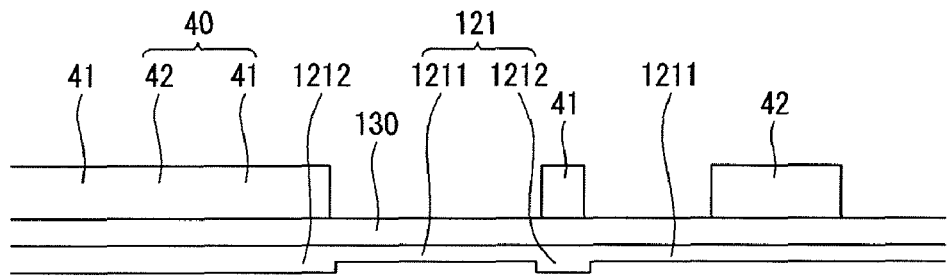
Figure 3E:
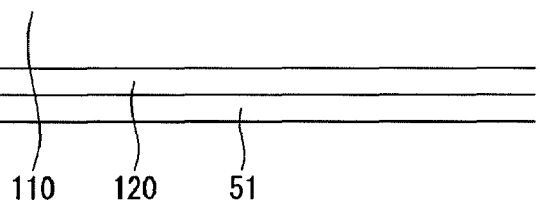
Figure 3F:
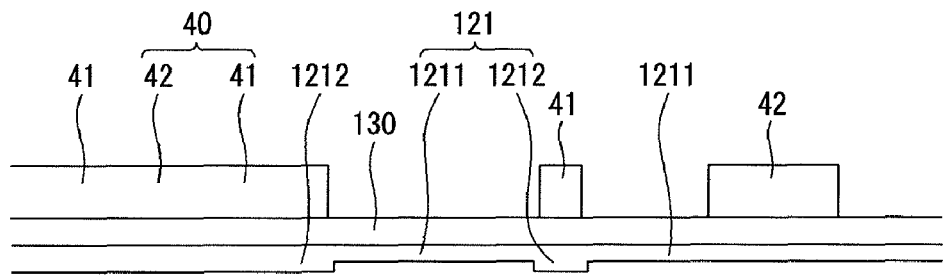
Figure 3F:
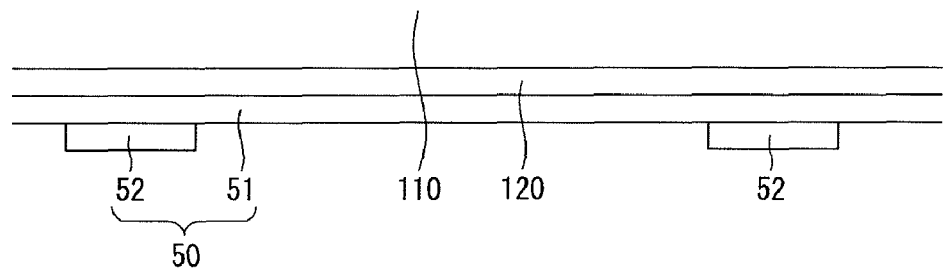

Next, as shown in FIG. 3E, a paste containing aluminum (Al) is printed on a desired portion of the back surface of the substrate 110 using the screen printing method and then is dried to form a back electrode pattern 51 on the back surface of the substrate 110. As shown in FIG. 3F, a paste containing silver (Ag) is printed on the back electrode pattern 51 using the screen printing method and then is dried to form a back bus bar pattern 52 on the back electrode pattern 51 at a location corresponding to the front bus bar pattern 42. Hence, a back electrode part pattern 50 including the back electrode pattern 51 and the back bus bar pattern 52 is formed.

In the embodiment of the invention, a formation order of the back electrode pattern 51 and the back bus bar pattern 52 may vary, and a formation order of the front electrode part pattern 40 and the back electrode pattern 50 may vary. Further, the back bus bar pattern 52 may be formed to directly adjoin the back surface of the substrate 110, in which case, the back electrode pattern 51 and the back bus bar pattern 52 may partially overlap each other.

In the embodiment of the invention, the front electrode part pattern 40 and the back electrode pattern 50 may dried at about 120° C. to 200° C.

Afterwards, the thermal process is performed on the substrate 110, on which the front electrode part pattern 40 and the back electrode pattern 50 are formed, at the temperature of about 750° C. to 800° C.

Hence, a front electrode part 140 including the plurality of front electrodes 141 connected to the second emitter region 1212 of the emitter part 121 and a plurality of front bus bars 142 connected to the first emitter region 1211 of the emitter part 121 except the portions crossing the front electrodes 141, a back electrode part 150 including a back electrode 151 electrically connected to the substrate 110 and a plurality of back bus bars 152 connected to the back electrode 151, and a BSF region 172 positioned at the back surface of the substrate 110 adjoining the back electrode 151 are formed. In the embodiment, each of the plurality of front bus bars 142 is connected to the first and second emitter regions 1211 and 1212.

Hence, a solar cell 11 is completed (with reference to FIGS. 1 and 2).

More specifically, when the thermal process is performed, the front electrode part pattern 40 passes through the anti-reflection layer 130 contacting the front electrode part pattern 40 due to lead (Pb), etc., contained in the front electrode part pattern 40 to form the plurality of front electrodes 141 contacting the second emitter region 1212 of the emitter part 121 and the plurality of front bus bars 142 contacting the first emitter region 1211 of the emitter part 121. Hence, the front electrode part 140 is completed.

The front electrode pattern 41 of the front electrode part pattern 40 forms the plurality of front electrodes 141, and the front bus bar pattern 42 of the front electrode part pattern 40 forms the plurality of front bus bars 142.

Further, when the thermal process is performed, the back electrode pattern 51 of the back electrode part pattern 50 forms the back electrode 151, and the back bus bar pattern 52 of the back electrode part pattern 50 forms the plurality of back bus bars 152. Aluminum (Al) contained in the back electrode pattern 51 is diffused into the impurity doped region 120 positioned at the back surface of the substrate 110 and the inside of the substrate 110 passing through the impurity doped region 120 to form the BSF region 172 having an impurity concentration higher than the substrate 110 at the back surface of the substrate 110. Hence, the back electrode 151 contacts the BSF region 172, and thus, is electrically connected to the substrate 110.

In the thermal process, a contact resistance decreases due to the chemical combination between the metal components contained in the patterns 40 and 50 and the components 121, 110, and 151 contacting one another. Hence, the transfer efficiency of carriers is improved, and the flow of current increases.

Afterwards, an edge isolation process for removing the impurity doped region 120 which is diffused into edges of the substrate 110 and is doped on the edges of the substrate 110, is performed using the laser beam or the etching process to complete the solar cell 11. A performance order of the edge isolation process may vary, if necessary or desired. Further, the edge isolation process may be omitted. For example, when the impurity doped region 120 is formed only at the front surface of the substrate 110 using the coating method or the ion implantation method, the edge isolation process may be omitted because the impurity doped region 120 is not formed at the back surface of the substrate 110.

In the embodiment of the invention, a separate process for removing the impurity doped region 120 formed at the back surface of the substrate 110 is not performed. However, in alternative example, before the back electrode part pattern 50 is formed, a separate process for removing the impurity doped region 120 positioned at the back surface of the substrate 110 may be performed.

Figure 8:
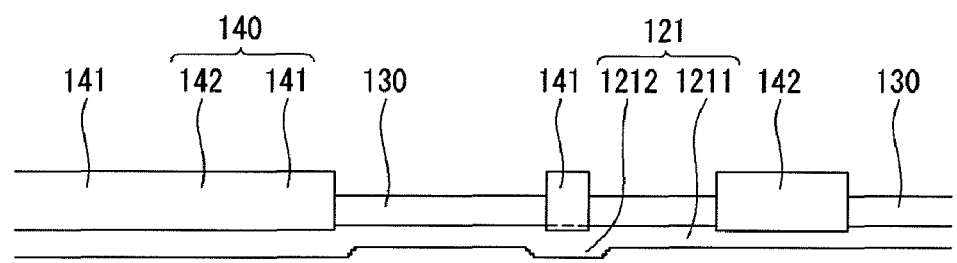
FIG. 8 is a partial cross-sectional view of a solar cell according to another example embodiment of the invention.
Figure 8:
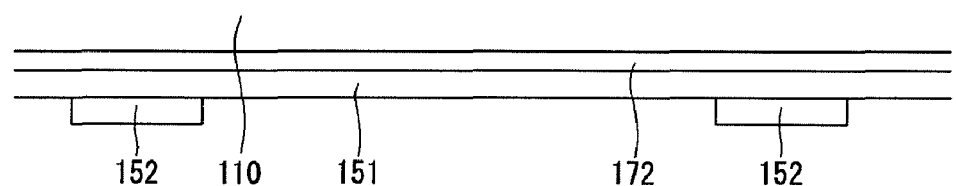
Figure 9:
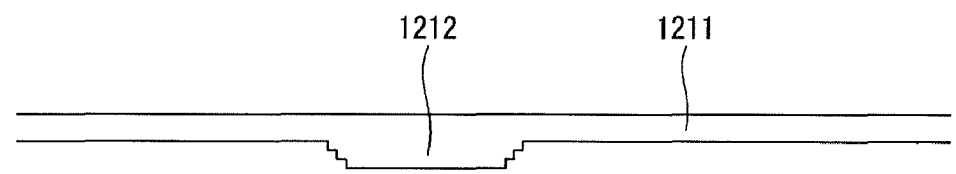
FIG. 9 is a cross-sectional view illustrating changes in an impurity doping thickness between a first emitter region and a second emitter region.
Figure 9:
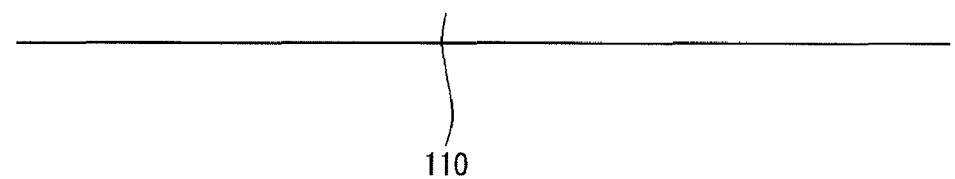

In a solar cell according to another embodiment of the invention, as shown in FIGS. 8 and 9, when laser shots are overlappingly irradiated onto an impurity doped region to form a heavily doped region having a relatively high impurity doping concentration under a plurality of front electrodes 141 as described above, an impurity doping concentration sequentially changes in an area around the side of each front electrode 141 ranging from a first emitter region 1211 to a second emitter region 1212, namely, in an area ranging from the first emitter region 1211 to the second emitter region 1212 with respect to the side of each front electrode 141. In other words, because an overlap rate of the laser shots changes in a portion of the impurity doped region positioned in an area to form the front electrodes 141, the irradiation number of laser shots does not change from a first value to a second value in an area existing around the side of each front electrode 141. Namely, the irradiation number of laser shots gradually increases from the first value to the second value via several values between the first value and the second value. Hence, the laser shots may be irradiated onto the area to form the front electrodes 141 by the desired irradiation number of laser shots.

As above, as the impurity doping concentration gradually changes from the first emitter region 1211 to the second emitter region 1212, each of an impurity doping thickness and a sheet resistance gradually changes from the first emitter region 1211 to the second emitter region 1212.

Accordingly, when carriers move to the second emitter region 1212 from the first emitter region 1211, a buffer region, in which a sheet resistance gradually changes from a sheet resistance of the first emitter region 1211 to a sheet resistance of the second emitter region 1212, exists between the first emitter region 1211 and the second emitter region 1212. Therefore, the buffer region makes it easier for carriers to move from the first emitter region 1211 to the second emitter region 1212. As a result, an amount of carriers moving from the first emitter region 1211 to the second emitter region 1212 further increases. In embodiments of the invention, the buffer region may include an incline or may include a plurality of steps.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a solar cell, the method comprising:

forming an impurity doped region of a second conductive type at a substrate of a first conductive type;

sequentially irradiating laser shots onto the impurity doped region of the substrate to form an emitter part including a first emitter region having a first sheet resistance and a second emitter region having a second sheet resistance less than the first sheet resistance; and forming a plurality of first electrodes connected to the second emitter region and forming a second electrode connected to the substrate, wherein a total overlap area of the laser shots irradiated onto a unit area of a first area of the impurity doped region to form the first emitter region is less than a total overlap area of the laser shots irradiated onto a unit area of a second area of the impurity doped region to form the second emitter region.

2. The method of claim 1, wherein a maximum irradiation number of the laser shots irradiated onto the unit area of the second area is greater than a maximum irradiation number of the laser shots irradiated onto the unit area of the first area.

3. The method of claim 1, wherein a first laser shot and a second laser shot of the laser shots are irradiated onto the first area and the second area, wherein an overlap area between the first laser shot and the second laser shot in the second area is greater than an overlap area between the first laser shot and the second laser shot in the first area.

4. The method of claim 3, wherein an overlap rate between the first laser shot and the second laser shot in the second area is greater than an overlap rate between the first laser shot and the second laser shot in the first area.

5. The method of claim 4, wherein the overlap rate between the first laser shot and the second laser shot in the second area is about 90% to 95%, and the overlap rate between the first laser shot and the second laser shot in the first area is about 70% to 80%.

6. The method of claim 1, wherein a width of the laser shots irradiated onto the first area is equal or greater than a width of the laser shots irradiated onto the second area.

7. The method of claim 6, wherein the laser shots together have a stripe shape, and a length of the laser shots is equal or greater than a length of one side of the substrate parallel to the plurality of first electrodes.

8. The method of claim 1, wherein the forming of the plurality of first electrodes and the second electrode includes forming a bus bar which extends in a direction crossing the plurality of first electrodes and is connected to the first emitter region and the plurality of first electrodes.

9. The method of claim 8, wherein a portion of the bus bar crossing the plurality of first electrodes is connected to the second emitter region.

10. The method of claim 1, wherein the forming of the impurity doped region includes depositing impurities of the second conductive type on the substrate to form the impurity doped region.

11. The method of claim 1, wherein the forming of the impurity doped region includes implanting impurities of the second conductive type into the substrate using an ion implantation method to form the impurity doped region inside the substrate.

12. The method of claim 1, wherein the forming of the impurity doped region includes applying a paste or an ink containing impurities of the second conductive type on the substrate and drying the paste or the ink applied on the substrate to form the impurity doped region on the substrate.

13. The method of claim 1, wherein the first sheet resistance is about 90 $\Omega$/sq. to 120 $\Omega$/sq., and the second sheet resistance is about 30 $\Omega$/sq. to 50 $\Omega$/sq.

14. The method of claim 1, wherein the forming of the plurality of first electrodes and the second electrode includes forming a bus bar which extends in a direction crossing the plurality of first electrodes and is connected to the first emitter region and the plurality of first electrodes.

15. The method of claim 14, wherein a portion of the bus bar crossing the plurality of first electrodes is connected to the second emitter region.

16. The method of claim 14, further comprising forming an anti-reflection layer on the emitter part,
- wherein the plurality of first electrodes and the bus bar pass through the anti-reflection layer and are connected to at least one of the first emitter region and the second emitter region.

17. The method of claim 14, wherein the sequentially irradiating of the laser shots onto the impurity doped region of the substrate occurs parallel to a direction the bus bar extends.

18. The method of claim 1, wherein the forming of the plurality of first electrodes and the second electrode includes forming a surface field region in the substrate adjoining the second electrode when the second electrode is formed.

19. The method of claim 1, wherein the impurity doped region has a sheet resistance of about 300 $\Omega$/sq. to 400 $\Omega$/sq.

20. The method of claim 1, wherein an impurity doping thickness of the first emitter region is different from an impurity doping thickness of the second emitter region.

* * * * *